United States Patent [19]

Fruhling

[11] Patent Number: 5,146,397

[45] Date of Patent: Sep. 8, 1992

[54] POWER SUPPLY DEVICE WITH UNBALANCE MONITORING CIRCUIT

[75] Inventor: Gerhard Fruhling, Nurnberg, Fed. Rep. of Germany

[73] Assignee: U. S. Philips Corporation, New York, N.Y.

[21] Appl. No.: 626,654

[22] Filed: Dec. 13, 1990

[30] Foreign Application Priority Data

Dec. 19, 1989 [DE] Fed. Rep. of Germany ....... 3941885

[51] Int. Cl.$^5$ ........................................... G01R 31/14
[52] U.S. Cl. ...................................... 363/74; 363/51; 361/42; 340/650; 324/509
[58] Field of Search ............... 324/509, 510; 340/650, 340/651; 361/42; 363/51, 74

[56] References Cited

U.S. PATENT DOCUMENTS

| | | | |
|---|---|---|---|
| 2,989,694 | 6/1961 | Fath et al. | 324/509 |
| 3,621,334 | 11/1971 | Burns | 361/45 |
| 3,631,321 | 12/1971 | Eisenstadt | 361/42 |
| 3,754,221 | 8/1973 | Stelter | 340/651 |
| 3,766,435 | 10/1973 | Childers | 324/510 |
| 4,430,683 | 2/1984 | Kawai et al. | 361/42 |
| 4,731,723 | 3/1988 | Nogi et al. | 363/70 |
| 4,929,901 | 5/1990 | Kimball et al. | 340/651 |

*Primary Examiner*—Jeffrey Sterrett
*Attorney, Agent, or Firm*—Bernard Franzblau

[57] ABSTRACT

A power supply device with a monitoring circuit for detecting an unbalance in a direct voltage transmitted between two line conductors and which is normally balanced with respect to ground potential. A voltage divider circuit is arranged between the two line conductors and consists of components which are identical in pairs. The center tap of the voltage divider is connected to ground potential and at further taps thereof in each case positive and negative part-voltages are produced. A first positive part voltage is compared with a second negative part voltage and a second positive part voltage is compared with a first negative part-voltage so that the balance of the direct voltage with respect to ground potential is simply and reliably monitored.

20 Claims, 1 Drawing Sheet

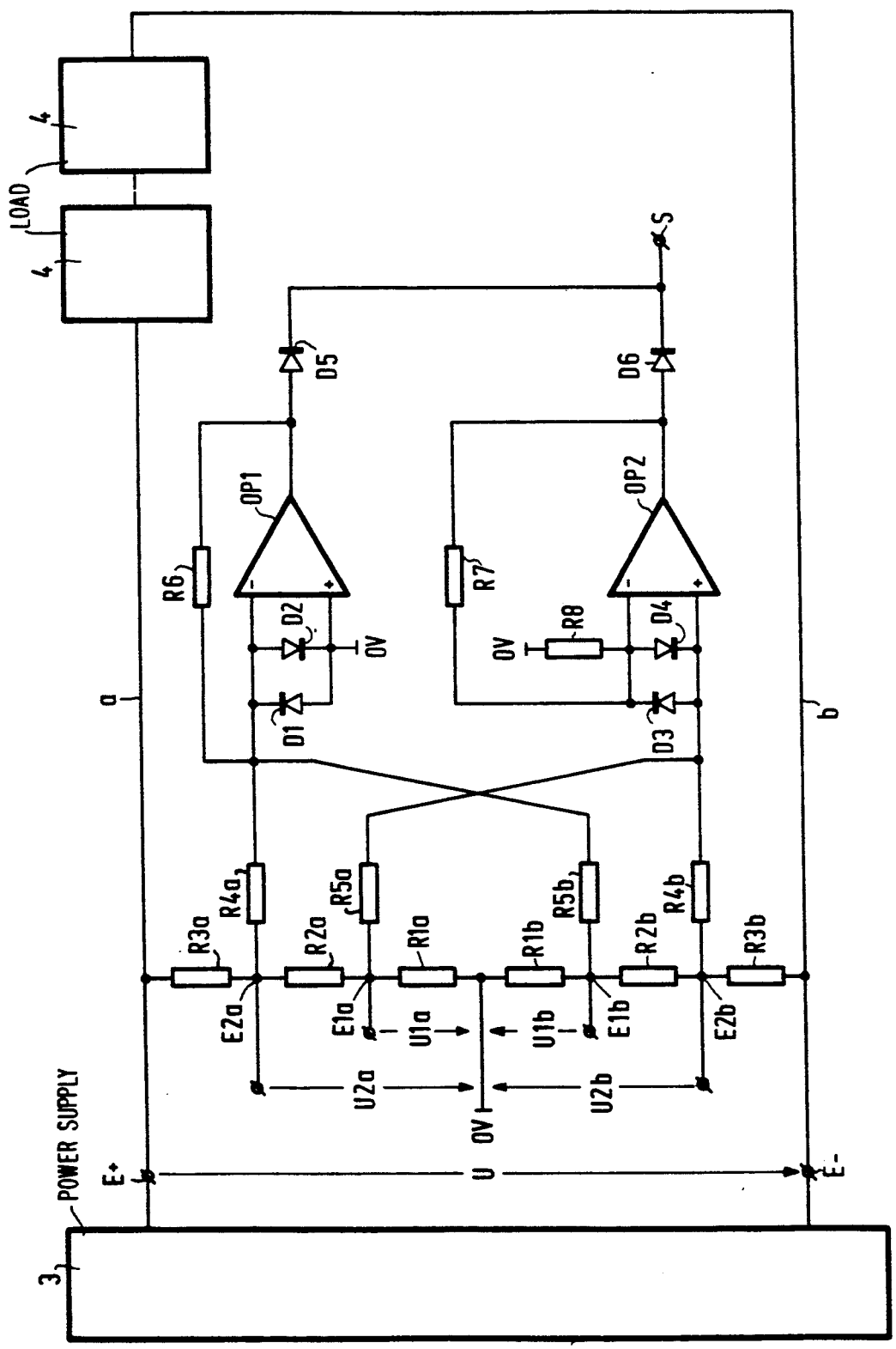

POWER SUPPLY DEVICE WITH UNBALANCE MONITORING CIRCUIT

BACKGROUND OF THE INVENTION

This invention relates to a power supply device including a unbalance monitoring circuit for a direct voltage transmitted between two line conductors, and which is balanced with respect to ground potential.

In optical communication transmission systems, two metallic line conductors are provided in parallel with the fibre glass lines transmitting the communication signals. The metallic line conductors supply a direct voltage, generated by a power supply device, to the line devices of the transmission link, for example, amplifiers (power feeding). For this purpose, the first line conductor is connected to the pole of the direct voltage which is positive with respect to ground potential and the second line conductor is connected to the pole which is negative with respect to the ground potential. The amplitude of the potential existing at the positive pole corresponds to the amplitude of the potential occurring at the negative pole. Thus, a direct voltage is present between the two line conductors which is balanced with respect to ground potential. The line devices connected to the transmission system are grounded in each case. If a line conductor is damaged, for example, due to digging work, and, as a result, this line conductor is connected to the ground potential (unilateral ground fault), this unbalance of the direct voltage results in a disturbance or a failure of the line devices that are energized by the direct voltage. The purpose of an unbalance monitoring circuit is to monitor this operating condition.

SUMMARY OF THE INVENTION

It is an object of the invention to provide a power supply device of the type initially mentioned which, in a simple manner, reliably monitors the balance of the direct voltage with respect to the ground potential.

In a power supply device of the type initially mentioned, this object is achieved in that between the two line conductors, a voltage divider circuit is arranged which consists of components which are in each case identical in pairs, the centre tap of which is connected to the ground potential and at the further taps of which positive and negative part-voltages referred to ground potential can be picked up, in which arrangement, in each case, a first positive part-voltage is compared with a second negative part-voltage and a second positive part-voltage is compared with a first negative part-voltage.

The balance of the direct voltage with respect to ground potential is reliably monitored by comparing the first positive part-voltage with the second negative part-voltage and by comparing the second positive part-voltage with the first negative part-voltage, respectively.

In one embodiment, in each case one tap for a positive and a negative part-voltage is connected to a comparator. In this arrangement, a direct voltage which is needed in any case in the power supply device, for example, for a control circuit, is used as the voltage supply for the comparators of the unbalance monitoring circuit. Due to the fact that no individual separate supply voltage, which, in particular, is floating with respect to the direct voltage, is needed for operating the unbalance monitoring circuit, the unbalance monitoring circuit can also be simply and inexpensively retrofitted to power supply devices already installed.

In a further embodiment, the comparators for the part-voltages are constructed as operational amplifiers, the inverting input of the first operational amplifier being connected via in each case one component of the voltage divider circuit to the taps for the second positive and the first negative part-voltage and the non-inverting input of the second operational amplifier being connected via in each case one component to the taps for the first positive and the second negative part-voltage, and the non-inverting input of the first and the inverting input of the second operational amplifier being connected to ground potential. In this arrangement, the output voltage of the two operational amplifiers in each case becomes zero with balance, whearas a disturbance is signalled when an unbalance of the direct voltage occurs with respect to the ground potential.

In one embodiment, the components of the voltage divider circuits are constructed as resistors, which results in an operating threshold of the operational amplifiers dependent on the respective value of the direct voltage.

By constructing the components between the taps as diodes, the operating threshold of the operational amplifiers can be made constant and thus independent of the respective value of the direct voltage.

Further advantageous embodiments are set forth in the dependent claims.

DESCRIPTION OF THE DRAWINGS

In the text which follows, the invention will be explained in greater detail with reference to the illustrative embodiment shown in the FIGURE.

The FIGURE shows a power supply device with unbalance monitoring circuit.

In the illustrative embodiment shown in the FIGURE, the unbalance monitoring circuit is located between a positive pole E+ and a negative pole E− of a direct voltage U which is balanced with respect to the ground potential, 0 V. The direct voltage U is supplied from a feeds power supply device 3 and power to two line devices 4, for example, of an optical communication transmission system, via two line conductors a, b. The line drawn dashed between the two line devices 4 indicates that further line devices can also be connected. The first line conductor a is connected to the positive pole E+ and the second line conductor b is connected to the negative pole E− of the direct voltage U. Between the two line conductors a, b and the ground potential 0 V there is located, in each case, a series circuit of six resistors R1a, R2a, R3a, R1b, R2b, R3b, which are in each case identical in pairs and at the taps E1a, E2a, E1b, E2b of which in each case two positive U1a, U2a and negative U1b, U2b, part-voltages referred to earth potential can be picked up. In this arrangement, the resistors R1a, R2a, R3a, R1b, R2b, R3b are dimensioned in a manner such that the value of the resistor R1a corresponds to the value of the resistor R1b, the value of the resistor R2a corresponds to the value of the resistor R2b and the value of the resistor R3a corresponds to the value of the resistor R3b. Thus, the first positive part-voltage U1a appears between the tap E1a and ground potential 0 V, and the second positive part-voltage U2a is derived across the series circuit of the resistors R1a, R2a between the tap E2a and ground potential 0 V. Correspondingly, a first negative part-voltage U1b is produced across the resistor R1b between the tap E1b and ground potential 0 V and a second negative part-voltage U2b is developed across the series circuit of the resistors R1b, R2b between the tap E2b and ground potential 0 V. The common tap E2a of the resistors R2a, R3a is connected via a resistor R4a to the inverting input of a first operational amplifier OP1, the non-inverting input of which is connected to ground potential 0 V. Furthermore, the inverting input of the first operational amplifier OP1 is connected via a resistor R5b to the common tap E1b of the resistors R1b, R2b. Correspondingly, the common tap E2b of the resistors R2b, R3b is connected via a resistor R4b to the non-inverting input of a second operational amplifier OP2, the inverting input of which is connected to ground potential 0 V via a resistor R8. The common tap E1a of the resistors R1a, R2a is likewise connected to the non-inverting input of the second operational amplifier OP2 via a resistor R5a. The two operational amplifiers OP1, OP2 in each case have feedback via a respective resistor R6, R7. Between the inverting and the non-inverting input of the operational amplifiers OP1, OP2, "anti-parallel-connected" diodes D1, D2, D3, D4 are in each case arranged. The outputs of the operational amplifiers OP1, OP2 are connected to a signalling connection S via diodes D5, D6, respectively. The operational amplifiers OP1, OP2 are operated with an auxiliary voltage referred to ground potential which can be supplied from the power supply device 3 and is in any case needed for a control circuit provided there.

In normal operation, that is to say when there is no disturbance in the supply of power of the direct voltage U via the line conductors 1, 2, the direct voltage U is balanced with respect to ground potential 0 V between the line conductor a and the line conductor b, that is to say the amplitude of the first positive part-voltage U1a is equal to the amplitude of the first negative part-voltage U1b and the value of the second positive part-voltage U2a is equal to the value of the second negative part-voltage U2b. This results in a voltage at the output of the first operational amplifier OP1 which results from the product of the feedback resistor R6 by the sum of the quotient of the second positive part-voltage U2a and of the resistor R4a and the quotient of the first negative part-voltage U1b and the resistor R5b. In this connection, the resistors R4a, R5b are dimensioned in a manner such that U2a/U1b=R4a/R5b. As a result, the ratio U2a/R4a becomes equal to the ratio U1b/R5b and the output voltage of the first operational amplifier OP1 becomes zero, that is to say there is no signalling of a disturbance via the signalling connection S. Resistors R4b, R5a are correspondingly dimensioned, that is to say the value of the resistor R4b corresponds to the value of the resistor R4a and the value of the resistor R5a corresponds to the value of the resistor R5b. Thus, the output voltage of the second operational amplifier OP2 also becomes zero in normal operation.

If, however, there is an unbalance of the direct voltage U with respect to ground potential 0 V, and thus also an unbalance of the positive and negative part-voltages, for example, due to a disturbance caused by digging work, the ground of the quotient U2a/R4a is no longer equal to the value of the quotient U1b/R5b. As a result, the output voltage of the first operational amplifier OP1 also assumes a value which differs from zero and which causes, for example, a light-emitting diode to be operated via the signalling connection S and thus signals the disturbance. The signalling connection S is correspondingly activated via the second operational amplifier OP2.

The operating threshold of the operational amplifiers OP1, OP2, is determined via the resistors R1a, R2a and R1b, R2b respectively. In this connection, the operating threshold in the illustrative embodiment shown in the FIGURE is selected to be proportional to the direct voltage U which can assume, for example, values of between 30 and 1,200 volts in a practical circuit arrangement. In a further embodiment, not shown in the FIGURE, the resistors R2a, R2b are replaced, for example, by Zener diodes. Thus, the operating threshold can be selected to be constant, that is to say independent of the current value of the direct voltage U. Instead of the operational amplifiers OP1, OP2, for example, comparators can also be used, the output of which can be evaluated with the aid of a microprocessor.

I claim:

1. A power supply device with an unbalance monitoring circuit for a direct voltage transmitted between two line conductors, which voltage normally is balanced with respect to ground potential, comprising: a voltage divider circuit connected between the two line conductors and which includes components which are in each case identical in pairs, a centre tap of the voltage divider circuit being connected to the ground potential and at further taps thereof positive and negative part-voltages referred to ground potential are produced, and comparator means for comparing a first positive part-voltage with a second negative part-voltage and a second positive part-voltage with a first negative part-voltage.

2. A power supply device according to claim 4 wherein the components of the voltage divider circuit comprise ohmic resistors.

3. A power supply device according to claim 1 wherein the comparator means for the part-voltage comprise first and second operational amplifiers, an inverting input of the first operational amplifier being connected via first and second components to taps for the second positive and the first negative part-voltage, respectively, a non-inverting input of the second operational amplifier being connected via third and fourth components to taps for the first positive and the second negative part-voltage, respectively, and means connecting a non-inverting input of the first and an inverting input of the second operational amplifier to ground potential.

4. A power supply device according to claim 3 wherein each of the operational amplifiers are provided with feedback via a resistor.

5. A power supply device according to claim 4 further comprising first and second pairs of anti-parallel-connected diodes connected between the inverting and the non-inverting inputs of the respective first and second amplifiers.

6. A power supply device according to claim 3, further comprising means for coupling outputs of the operational amplifiers to one another to form a common junction operative as a signalling connection.

7. A power supply device according to claim 6 wherein each of the operational amplifiers in each case are provided with feedback via a resistor.

8. A power supply device according to claim 6 further comprising first and second pairs of anti-parallel-connected diodes connected between the inverting and the non-inverting inputs of the respective first and second amplifiers.

9. A power supply device according to claim 3 further comprising first and second pairs of anti-parallel-connected diodes connected between the respective inverting and the non-inverting input of the first and second operational amplifiers.

10. A power supply device according to claim 3, further comprising means for coupling outputs of the operational amplifiers to one another to form a common junction operative as a signalling connection.

11. A power supply device according to claim 1 wherein in each case, at least one tap for a positive and one tap for a negative part-voltage is connected to the comparator means.

12. A power supply device according to claim 11 wherein the comparator means for the part-voltages comprise first and second operational amplifiers, an inverting input of the first operational amplifier being connected via first and second components to taps for the second positive and the first negative part-voltage, respectively, a non-inverting input of the second operational amplifier being connected via third and fourth components to taps for the first positive and the second negative part-voltage, respectively, and means connecting a non-inverting input of the first and an inverting input of the second operational amplifier to ground potential.

13. A power supply device according to claim 11 wherein the components of the voltage divider circuit comprise ohmic resistors.

14. A circuit for monitoring an unbalance condition between two terminals of a direct voltage power supply balanced with respect to a reference potential, said monitoring circuit comprising:

a voltage divider circuit connected to said two power supply terminals and having a center tap coupled to said reference potential, said voltage divider circuit including at least a first pair of equal impedance components and a second pair of equal impedance components and with a first pair of taps at which, in a balanced voltage condition, equal first positive and negative part-voltages with respect to said reference potential are produced and a second pair of taps at which are produced equal second positive and negative part-voltages with respect to said reference potential, and comparator means coupled to the taps of the voltage divider circuit so as to compare the first positive part-voltage with the second negative part-voltage and to compare the second positive part-voltage with the first negative part-voltage.

15. A monitoring circuit as claimed in claim 14 wherein said comparator means includes at least one further input coupled to the reference potential and at least one pair of anti-parallel connected diodes coupled between the further input and one of said first and second inputs.

16. A monitoring circuit as claimed in claim 15 wherein said comparator means includes at least one operational amplifier with a feedback resistor connected between its output and its inverting input.

17. A monitoring circuit as claimed in claim 14 further comprising first ($R4a$) and second ($R4b$) resistors coupling said first pair of taps to first and second inputs, respectively, of the comparator means and third ($R5a$) and fourth ($R5b$) resistors coupling said second pair of taps to the second and first inputs, respectively, of the comparator means, and wherein first and second equal positive and negative part-voltages $U2a$ and $U2b$, respectively, are produced at the first pair of taps and third and fourth equal positive and negative part-voltages $U1a$ and $U2b$, respectively, are produced at the second pair of taps, and said first and fourth resistors ($R4a$ and $R5b$) are chosen so that $U2a/R1b = R4a/R5b$.

18. A monitoring circuit as claimed in claim 17 wherein said comparator means includes at least one operational amplifier with a feedback resistor connected between its output and its inverting input.

19. A monitoring circuit as claimed in claim 18 wherein said comparator means includes at least one further input coupled to the reference potential and at least one pair of anti-parallel connected diodes coupled between the further input and one of said first and second inputs.

20. A monitoring circuit as claimed in claim 17 wherein said comparator means includes at least one further input coupled to the reference potential and at least one pair of anti-parallel connected diodes coupled between the further input and one of said first and second inputs.

* * * * *

UNITED STATES PATENT AND TRADEMARK OFFICE
CERTIFICATE OF CORRECTION

PATENT NO. : 5,146,397
DATED : SEPTEMBER 8, 1992
INVENTOR(S) : GERHARD FRUHLING

It is certified that error appears in the above-indentified patent and that said Letters Patent is hereby corrected as shown below:

Column 1, line 7, change "a" (first occurrence) to --an--.

IN THE CLAIMS

Col. 4, claim 2, line 1, change "4" to --1--

Col. 4, claim 7, line 2, delete "in each case"

Col. 5, claim 11, line 2, after "wherein" insert --,-- (comma)

Col. 6, claim 17, line 13, change "U2a/R1b" to --U2a/U1b--

Signed and Sealed this

First Day of March, 1994

BRUCE LEHMAN

Attest:

Attesting Officer

Commissioner of Patents and Trademarks